United States Patent [19]

Tsuchikura

[11] 4,375,271
[45] Mar. 1, 1983

[54] SOLDERING METHOD FOR ELECTRIC AND OR ELECTRONIC COMPONENT

[75] Inventor: Katsuhiko Tsuchikura, Tokyo, Japan

[73] Assignee: Aiwa Co., Ltd., Tokyo, Japan

[21] Appl. No.: 287,798

[22] Filed: Jul. 28, 1981

[30] Foreign Application Priority Data

Aug. 1, 1980 [JP] Japan .................. 55-105107

[51] Int. Cl.³ .............................................. H05K 3/34
[52] U.S. Cl. .................. 228/180 R; 228/259; 228/37
[58] Field of Search .............. 228/37, 180 R, 260, 228/261, 256, 262, 259; 219/85 M

[56] References Cited

U.S. PATENT DOCUMENTS

| 3,589,590 | 6/1971 | Fitzsimmons | 228/180 |
| 3,705,457 | 12/1972 | Tardoskegyi | 228/37 |
| 4,019,671 | 4/1977 | Akyuerek | 228/259 |

Primary Examiner—Nicholas P. Godici
Assistant Examiner—K. Rowan
Attorney, Agent, or Firm—Birch, Stewart, Kolasch & Birch

[57] ABSTRACT

A soldering method comprises forming bubbles by blowing gas into a pool of molten solder, and striking the bubbles against a printed circuit board with electric and or electronic components temporarily fixed thereto to solder them to each other.

3 Claims, 2 Drawing Figures

SOLDERING METHOD FOR ELECTRIC AND OR ELECTRONIC COMPONENT

BACKGROUND AND OBJECTS OF THE INVENTION

The present invention relates to a method for soldering electric and or electronic components to printed-circuit boards using a pool of molten solder.

It has been well known heretofore that electric and or electronic components including chip type components temporarily fixed to a printed-circuit board are soldered to the circuit board by dipping the circuit surface into a static pool of molten solder. In such a soldering system, generation of flux gas and gas from the printed-circuit board itself takes place in a soldering operation and the gases tend to accumulate around terminal portions of the components to be soldered. The accumulated gases interfere with uniform soldering of the components to the circuit board. In order to eliminate this disadvantage, it has been a practice to position vent holes formed in the circuit board adjacent terminals of the components to be soldered. However, the existence of the vent holes results in a restriction of the circuits to be formed on the other surface of the board, preventing the circuits from being highly concentrated. Moreover, formation of the vent holes in the circuit board results in a high cost and a reduction in the strength of the board.

An attempt has been made to expel generated gases out of the terminal portions of the components by means of a high speed jet flow of molten solder towards the components. Such a soldering system is successfully applied to relatively thin flat chip components, but still there is a need for formation of vent holes to effect complete expelling of the gases in case that the soldering system is applied to large cylindrical chip components normally called metal electrode facebonding type components and mould type-transistors. Moreover, in this soldering system, uniform soldering can not be achieved because of the generation of waves on the top surface of the molten solder.

Accordingly, a main object of the present invention is to provide a novel and useful method for soldering to a printed-circuit board, electric and or electronic components temporarily fixed thereto while preventing flux gases which are generated in the soldering operation from accumulating around terminal portions of the components.

Another object of the present invention is to provide a method of the above-mentioned kind comprising conveying printed circuit board having the components temporarily fixed thereto along the top of a pool of molten solder, generating bubbles by blowing gas into the molten solder, the bubbles rapidly rising in the molten solder toward its top, and striking the rising bubbles against the circuit surface to expel any flux gases which otherwise would accumulate around terminal portions of the components and to solder the components to the board.

BRIEF DESCRIPTION OF THE DRAWINGS

Other objects and advantages of the present invention will become apparent from the following description made with reference to the accompanying drawings, in which.

DETAILED DESCRIPTION OF THE INVENTION

Figure 1:
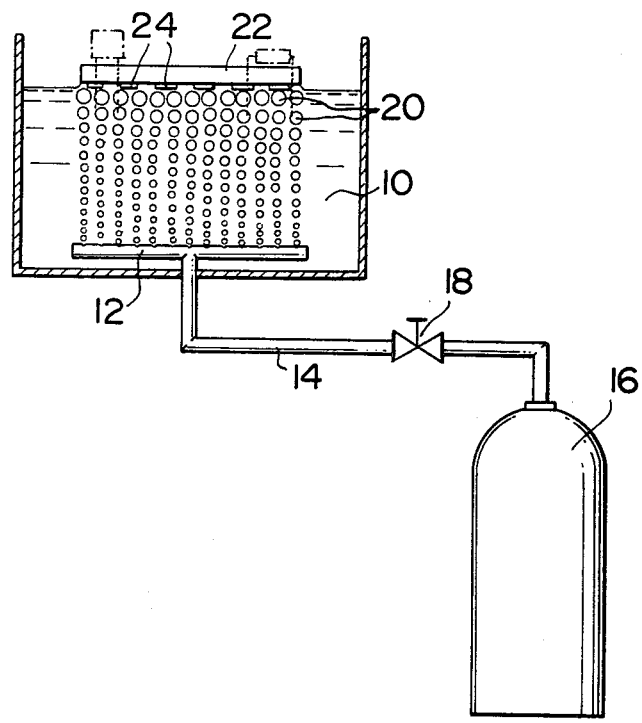
FIG. 1 is a transversal cross-sectional view showing a preferred embodiment of a soldering apparatus suitable to carry out a soldering method according to the present invention.
Figure 2:
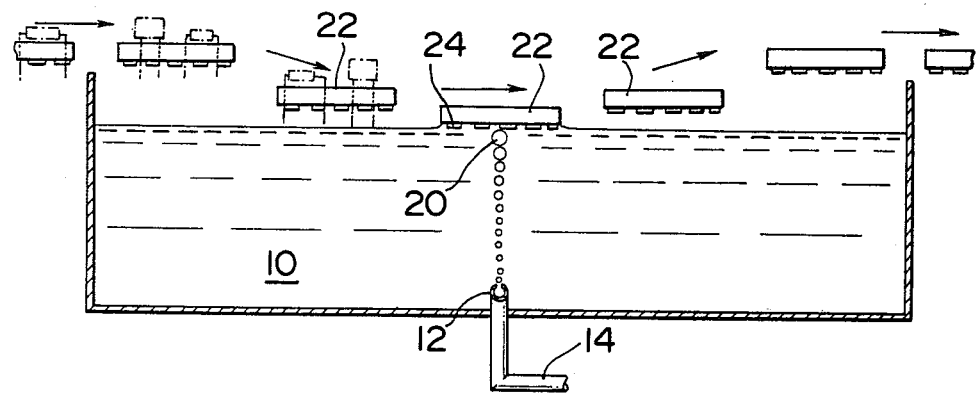
FIG. 2 is a longitudinal cross-sectional view of the soldering apparatus as shown in FIG. 1.

Referring to FIGS. 1 and 2 of the drawings, there is shown a soldering apparatus comprising a static pool of molten solder 10. A nozzle unit 12 is disposed in the pool of molten solder 10 adjacent its bottom and communicates through a pipe 14 with a gas cylinder 16 in which nitrogen gas is contained. A valve 18 is disposed in the pipe 14 for controlling a flow rate of the nitrogen gas from the gas cylinder 16 to the nozzle unit 12. The nitrogen gas from the cylinder 16 is blown through the nozzle unit 12 into the molten solder to form bubbles 20 which rise rapidly towards the top of the pool of molten solder and finally, burst at the top of the pool.

As will be seen in FIG. 2, printed circuit boards 22 each having electric and or electronic components including chip type components 24 are temporarily bonded thereto in a conventional manner and are conveyed along the top of the pool of molten solder 10. During movement of the printed circuit board 22 along the top of the pool, the rising bubbles 20 in the molten solder are struck against the printed circuit surface of the board 22 to burst at the top of the pool, thereby expelling any flux gases which otherwise would accumulate around terminal portions of the temporarily bonded chip components. Thus, the chip components are soldered to the printed circuit board by uniformly contacting with the molten solder.

The soldering method according to the present invention may be applied to either a high speed jet flow type pool of molten solder or a flow type pool of molten solder to achieve excellent soldering of chip components to a printed circuit board.

Although the preferred embodiment of the present invention has been described hereinbefore in conjunction with the use of nitrogen gas, either air or any inert gas other than the nitrogen gas may be used for formation of gas bubbles in the molten solder. Particularly, the use of inert gas is effective to prevent the molten solder from being oxidized by gas to be blown into the molten solder. Thus, wasteful consumption of the molten solder can be prevented.

It will be understood from the foregoing that the present invention has provided a novel soldering method for printed circuit board wherein electric and or electronic components temporarily bonded thereto are affixed using a pool of molten solder. The board and chip components can be uniformly dipped in the molten solder by striking bubbles against the components to expel any flux gases out of the terminal portions of the components. According to the present invention, any need for formation of conventional vent holes in the printed circuit board can be eliminated and this makes it possible to make a highly concentrated circuit on the board.

I claim:

1. A soldering method comprising conveying printed circuit boards with electric and or electronic components temporarily fixed thereto along the top of a pool of molten solder, generating bubbles by blowing gas into the molten solder, the bubbles rapidly rising in the molten solder toward its top and striking the rising bubbles against components and the board to achieve soldering of the components to the board.

2. A soldering method as claimed in claim 1 wherein said bubbles are generated by blowing inert gas into the molten solder.

3. A soldering method as claimed in claim 1 wherein said bubbles are generated by blowing air into the molten solder.

* * * * *